(12) United States Patent
Sohn et al.

(10) Patent No.: US 11,930,670 B2
(45) Date of Patent: Mar. 12, 2024

(54) DISPLAY DEVICE INCLUDING AN INTERLAYER INSULATING LAYER SELECTIVELY OVERLAPPING AN ACTIVE LAYER OF A DRIVING TRANSISTOR AND METHOD FOR MANUFACTURING THE SAME

(71) Applicants: Samsung Display Co., Ltd., Yongin-Si (KR); Industry-University Cooperation Foundation Hanyang University ERICA Campus, Ansan-si (KR)

(72) Inventors: Sang Woo Sohn, Yongin-si (KR); Saeroonter Oh, Seoul (KR); Joon Seok Park, Yongin-si (KR); Young Joon Choi, Busan (KR); Su Hyun Kim, Seongnam-si (KR); Jun Hyung Lim, Seoul (KR)

(73) Assignees: Samsung Display Co., Ltd., Yongin-si (KR); Industry-University Cooperation Foundation Hanyang University ERICA Campus, Ansan-si (KR)

( * ) Notice: Subject to any disclaimer, the term of this patent is extended or adjusted under 35 U.S.C. 154(b) by 246 days.

(21) Appl. No.: 17/313,046

(22) Filed: May 6, 2021

(65) Prior Publication Data
US 2021/0408195 A1    Dec. 30, 2021

(30) Foreign Application Priority Data
Jun. 25, 2020 (KR) .................. 10-2020-0077987

(51) Int. Cl.
*H10K 59/126* (2023.01)
*G09G 3/3225* (2016.01)
(Continued)

(52) U.S. Cl.
CPC ......... *H10K 59/126* (2023.02); *G09G 3/3225* (2013.01); *H10K 59/131* (2023.02); *H10K 71/00* (2023.02)

(58) Field of Classification Search
CPC .... H10K 59/12; H10K 59/124; H10K 59/126; H10K 59/131; H10K 71/00; H10K 71/40;
(Continued)

(56) References Cited

U.S. PATENT DOCUMENTS

2017/0263690 A1    9/2017 Lee et al.
2017/0358610 A1    12/2017 Hanyu et al.
(Continued)

FOREIGN PATENT DOCUMENTS

EP    3220420 B1    9/2017
JP    2018-170326 A    11/2018
(Continued)

OTHER PUBLICATIONS

Extended European Search Report, Application No. 21181074.2, dated Nov. 18, 2021, 7 pages.

*Primary Examiner* — Matthew E. Gordon
(74) *Attorney, Agent, or Firm* — Innovation Counsel LLP

(57) ABSTRACT

A display device comprises a substrate; a driving transistor including a first active layer and a switching transistor including a second active layer, the first active layer and the second active layer being disposed on the substrate; a first gate insulating layer disposed on the first active layer of the driving transistor and the second active layer of the switching transistor; first and second gate electrodes disposed on the first gate insulating layer to overlap the first active layer of the driving transistor and the second active layer of the switching transistor, respectively; a first interlayer insulating layer disposed on the first gate electrode and the second gate electrode; and a second interlayer insulating layer disposed (Continued)

on the first interlayer insulating layer to overlap the first active layer without overlapping the second active layer in a plan view.

13 Claims, 17 Drawing Sheets

(51) Int. Cl.
*H10K 59/131* (2023.01)
*H10K 71/00* (2023.01)

(58) Field of Classification Search
CPC ... H10K 71/421; H10K 71/441; G09G 3/3225
USPC .......................................................... 257/40
See application file for complete search history.

(56) References Cited

U.S. PATENT DOCUMENTS

| | | |
|---|---|---|
| 2018/0083084 A1 | 3/2018 | Kim et al. |
| 2018/0122886 A1* | 5/2018 | Kim .................... H10K 59/1216 |

FOREIGN PATENT DOCUMENTS

| | | | |
|---|---|---|---|
| JP | 2019-036615 A | 3/2019 | |
| KR | 100807554 B1 * | 2/2008 | ......... H01L 27/1248 |
| KR | 10-2013-0074980 A | 7/2013 | |
| KR | 10-2015-0100568 A | 9/2015 | |
| KR | 10-2020-0023573 A | 3/2020 | |

\* cited by examiner

FIG. 6

| Buffer | Material | [H] (number/cm$^3$) |
|---|---|---|
| ILD 1 | SiON$_x$ | $1.34 \times 10^{20}$ |
| ILD 2 | SiN$_x$ | $2.46 \times 10^{22}$ |

FIG. 7

| Other candidates | Material | [H] (number/cm$^3$) |
|---|---|---|
| ILD 1 | SiO$_x$ | $7.21 \times 10^{20}$ |
| ILD 2 | SiON$_x$ | $1.32 \times 10^{21}$ |
| | | $1.96 \times 10^{22}$ |

DISPLAY DEVICE INCLUDING AN INTERLAYER INSULATING LAYER SELECTIVELY OVERLAPPING AN ACTIVE LAYER OF A DRIVING TRANSISTOR AND METHOD FOR MANUFACTURING THE SAME

CROSS-REFERENCE TO RELATED APPLICATION

This application claims priority to Korean Patent Application No. 10-2020-0077987 filed on Jun. 25, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device and a method for manufacturing the same.

2. Description of the Related Art

In accordance with the development of the information society, more and more demands are placed on display devices for displaying images in various ways. The display devices include a liquid crystal display (LCD), a plasma display panel (PDP), an organic light emitting display (OLED), and a micro light emitting diode display.

The OLED and the micro light emitting diode display may include a light emitting diode, a driving transistor for controlling the amount of a driving current flowing through the light emitting diode, and a switching transistor for applying a data voltage to the gate electrode of the first transistor in response to a scan signal of a scan line.

A driving voltage of the driving transistor indicates a voltage applied to the gate electrode of the driving transistor to make the driving current flow. A driving voltage range of the driving transistor indicates a voltage range from a first voltage at which a predetermined minimum driving current flows to a second voltage at which a predetermined maximum driving current flows.

SUMMARY

Aspects of the present disclosure provide a display device in which element characteristics of a driving transistor and a switching transistor of each of pixels are improved.

Aspects of the present disclosure also provide a method for manufacturing a display device in which element characteristics of a driving transistor and a switching transistor of each of pixels are improved.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment, a display device comprises a substrate; a driving transistor including a first active layer and a switching transistor including a second active layer, the first active layer and the second active layer being disposed on the substrate; a first gate insulating layer disposed on the first active layer of the driving transistor and the second active layer of the switching transistor; first and second gate electrodes disposed on the first gate insulating layer to overlap the first active layer of the driving transistor and the second active layer of the switching transistor, respectively; a first interlayer insulating layer disposed on the first gate electrode and the second gate electrode; and a second interlayer insulating layer disposed on the first interlayer insulating layer to overlap the first active layer without overlapping the second active layer in a plan view.

According to another embodiment, a method for manufacturing a display device comprises forming a first active layer and a second active layer; sequentially forming a gate insulating layer and a gate electrode on each of the first active layer and the second active layer; forming a first interlayer insulating layer on the gate electrode; and forming a second interlayer insulating layer on the first interlayer insulating layer, wherein a hydrogen concentration of the second interlayer insulating layer is greater than that of the first interlayer insulating layer.

In accordance with the display device and the method for manufacturing the same according to an embodiment, it is possible to improve the element characteristics of the driving transistor and the switching transistor of each of pixels.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which:

FIGS. 6 and 7 are tables showing the materials and the hydrogen concentrations of the first interlayer insulating layer and the second interlayer insulating layer;

DETAILED DESCRIPTION OF THE EMBODIMENTS

Figure 1:
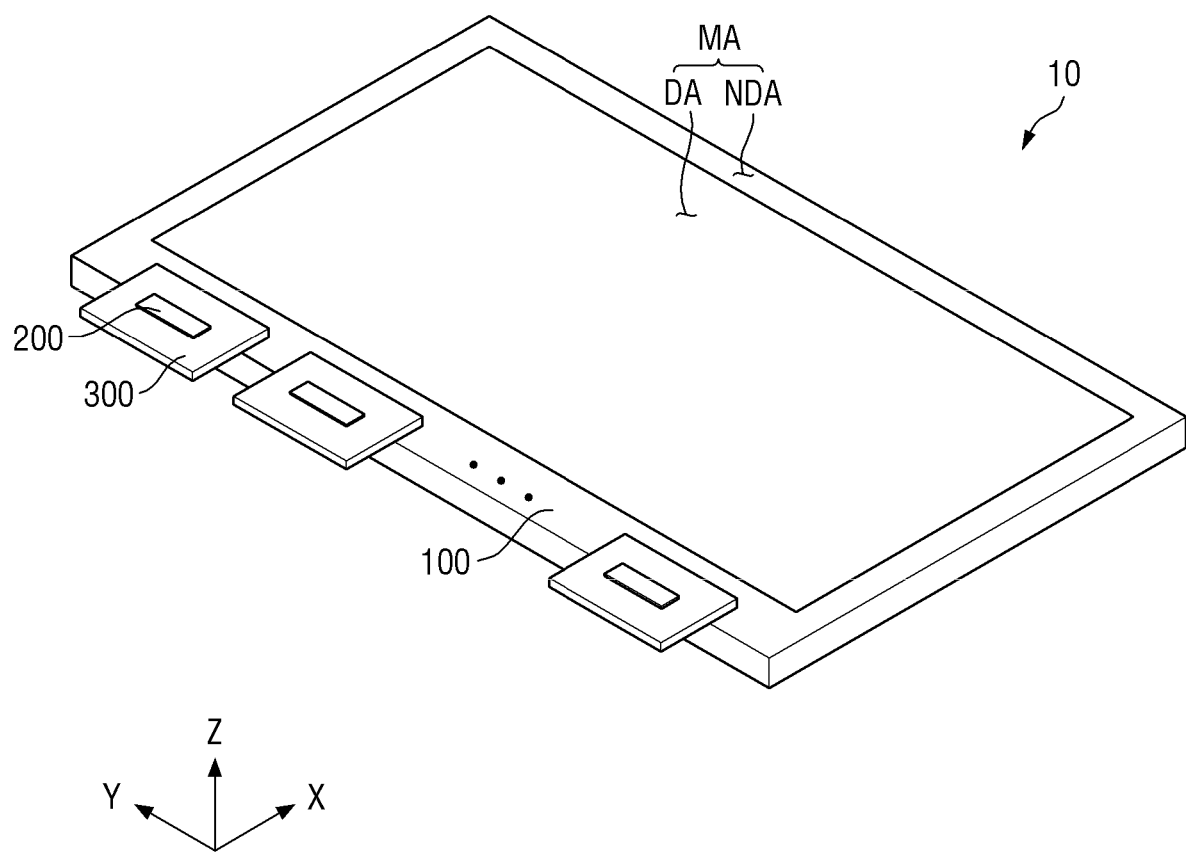
FIG. 1 is a perspective view of a display device according to an exemplary embodiment.

Specific structural and functional descriptions of embodiments of the inventive concept disclosed herein are only for illustrative purposes of the embodiments of the inventive concept. The inventive concept may be embodied in many different forms without departing from the spirit and significant characteristics of the inventive concept. Therefore, the embodiments of the inventive concept are disclosed only for illustrative purposes and should not be construed as limiting the inventive concept. That is, the inventive concept is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the inventive concept will be described with reference to the attached drawings.

Figure 2:
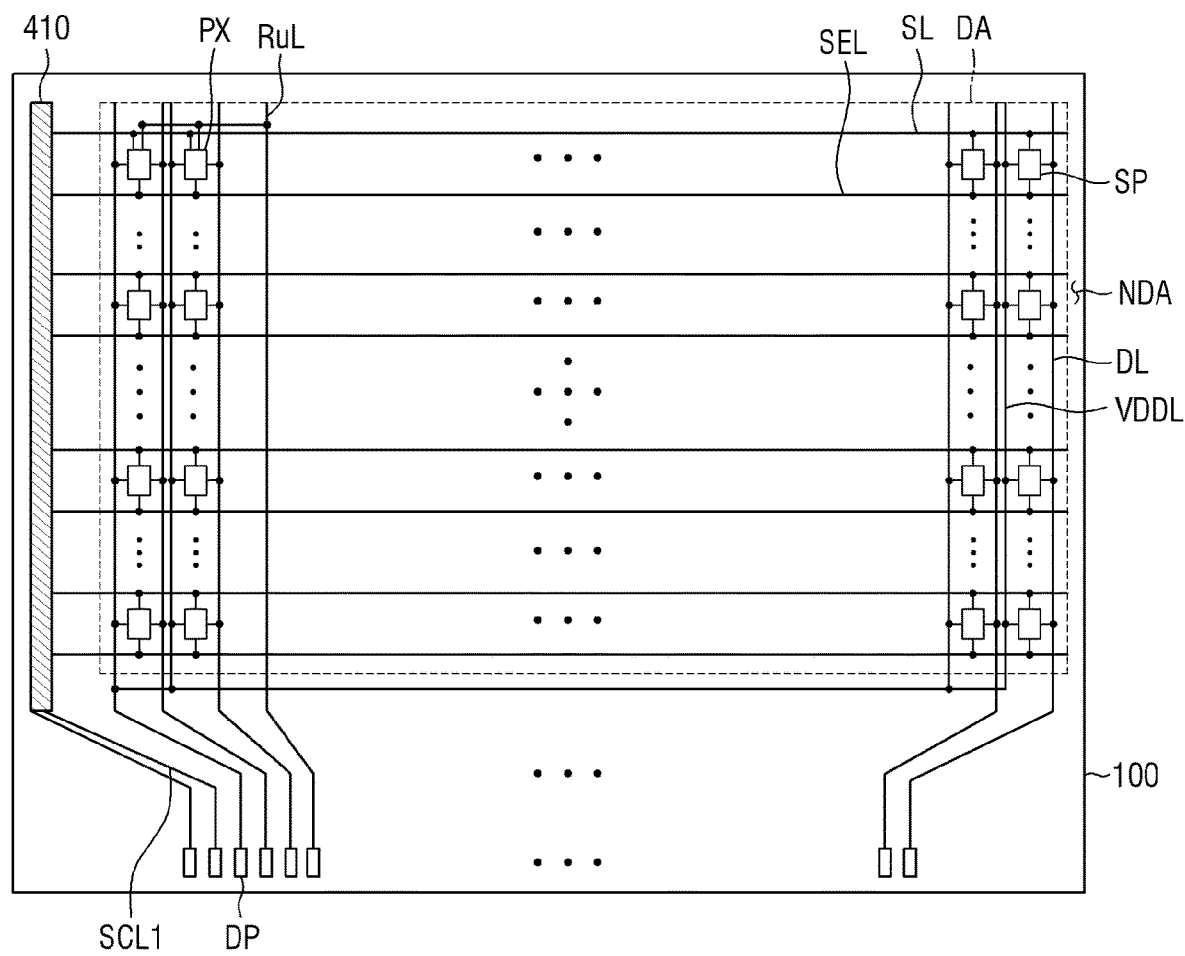
FIG. 2 is a plan view illustrating an example of a display panel according to an exemplary embodiment.

FIG. 1 is a perspective view of a display device according to an exemplary embodiment. FIG. 2 is a plan view illustrating an example of a display panel according to an exemplary embodiment.

The terms "above," "top" and "upper surface" used herein refer to an upward direction (i.e., a Z-axis direction) with respect to a display panel 100. The terms "below," "bottom" and "lower surface" used herein refer to a downward direction (i.e., a direction opposite to the Z-axis direction) with respect to the display panel 100. Further, "left", "right", "upper" and "lower" indicate directions when the display panel 100 is viewed from above. For example, the term "left" indicates a direction opposite to an X-axis direction, the term "right" indicates the X-axis direction, the term "up" indicates a Y-axis direction, and the term "down" indicates a direction opposite to the Y-axis direction.

A display device 10 is a device for displaying a moving image or a still image. The display device 10 may be used as a display screen of various products such as televisions, laptop computers, monitors, billboards and the Internet of Things (JOT) as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs). The display device 10 may be any one of an organic light emitting display device, a liquid crystal display device, a plasma display device, a field emission display device, an electrophoretic display device, an electrowetting display device, a quantum dot light emitting display device, a micro LED display device, and the like. In the following description, it is assumed that the display device 10 is an organic light emitting display device, but the present disclosure is not limited thereto.

Referring to FIGS. 1 and 2, the display device 10 according to an exemplary embodiment includes a display panel 100, a display driver 200, and a circuit board 300.

The display panel 100 may be formed in a rectangular shape in a plan view, having short sides in a first direction (X-axis direction) and long sides in a second direction (Y-axis direction) crossing the first direction (X-axis direction). The corner where the short side in the first direction (X-axis direction) and the long side in the second direction (Y-axis direction) meet may be right-angled. In some embodiments, the corner where the short side in the first direction (X-axis direction) and the long side in the second direction (Y-axis direction) meet may be rounded to have a predetermined curvature.

The planar shape of the display panel 100 is not limited to a rectangular shape, and may be formed in other polygonal shapes, a circular shape or elliptical shape. The display panel 100 may be formed to be flat. However, without being limited thereto, the display panel 100 may include a curved portion formed at left and right ends and having a predetermined curvature or a varying curvature. In addition, the display panel 100 may be formed flexibly such that it can be twisted, bent, folded, or rolled.

The display panel 100 may include a display area DA where pixels PX are formed to display an image and a non-display area NDA which is a peripheral area of the display area DA. When the display panel 100 includes a curved surface portion, the display area DA may be disposed on the curved portion. In this case, the image of the display panel 100 may also be seen through the curved portion.

In addition to the pixels PX, scan lines SL connected to the pixels PX, sensing signal lines SEL, data lines DL, reference voltage lines RuL, and first driving voltage lines VDDL may be arranged in the display area DA The scan lines SL and the sensing signal lines SEL may be formed in parallel in the second direction (Y-axis direction). The data lines DL and the reference voltage lines RuL may be formed in parallel in the first direction (X-axis direction) crossing the second direction (Y-axis direction). The first driving voltage lines VDDL may be formed in parallel along the first direction (X-axis direction) in the display area DA. The first driving voltage lines VDDL formed in parallel along the first direction (X-axis direction) in the display area DA may be connected to each other in the non-display area NDA.

Each of the pixels PX may be connected to at least one of the scan lines SL, one of the data lines DL, at least one of the sensing signal lines SEL, one of the reference voltage lines RuL, and one of the first driving voltage lines VDDL. For simplicity of description, FIG. 2 illustrates that each of the pixels PX is connected to one scan line SL, one data line DL, one sensing signal line SEL, one reference voltage line RuL, and the first driving voltage line VDDL, but it is not limited thereto. For example, each of the pixels PX may be connected to more than one scan line, for example, two scan lines SL or three scan lines SL.

Each of the pixels PX may include a driving transistor, at least one switching transistor, a light emitting element, and a capacitor. The driving transistor may control an amount of current flowing through the light emitting element EML to control intensity of light emitted by the light emitting element EML. The amount of current flowing through the light emitting element EML may be controlled by the data voltage applied to the gate electrode of the driving transistor. The driving transistor and the at least one switching transistor may be thin film transistors. The light emitting element may emit light according to the driving current of the driving transistor. The light emitting element may be an organic light emitting diode including a first electrode, an organic light emitting layer and a second electrode that are sequentially stacked. The capacitor may maintain the data voltage applied to the gate electrode of the driving transistor.

The non-display area NDA may be an area surrounding the display area DA and disposed outside of the display area DA. A scan driver 410 for applying scan signals to the scan lines SL and pads DP connected to the data lines DL may be disposed in the non-display area NDA. Since the circuit board 300 is attached to the pads DP, the pads DP may be disposed at one edge of the display panel 100, e.g., at the lower edge of the display panel 100 as disclosed in FIG. 2.

The scan driver 410 may be connected to the display driver 200 through a plurality of first scan control lines SCL1. The scan driver 410 may receive a scan control signal from the display driver 200 through the pads DP and the plurality of first scan control lines SCL1. The scan driver 410 may generate scan signals in response to the scan control signal and sequentially output the scan signals to the scan lines SL. The pixels PX, to which data voltages are to be supplied, are selected by the scan signals from the scan driver 410 and the data voltages are supplied to the selected pixels PX.

In FIG. 2, the scan driver 410 is disposed at one side of the display area DA in the non-display area NDA, but the present disclosure is not limited thereto.

The display driver 200 receives digital video data and timing signals from the outside, for example, from a graphic controller (not shown). The display driver 200 converts the digital video data into analog positive/negative data voltages and supplies them to the data lines DL. The display driver 200 generates and supplies the scan control signal for controlling an operation timing of the scan driver 410 through the first scan control lines SCL1. In addition, the display driver 200 may supply a first driving voltage to the first driving voltage line VDDL.

The display driver 200 may be formed of an integrated circuit (IC) and attached onto the circuit board 300 by a chip on film (COF) method. Alternatively, the display driver 200 may be directly attached onto the display panel 100 by a chip on glass (COG) method, a chip on plastic (COP) method, or an ultrasonic bonding method.

The circuit board 300 may be attached onto the pads DP using an anisotropic conductive film. Accordingly, lead wires of the circuit board 300 may be electrically connected to the pads DP. The circuit board 300 may be a flexible film, such as a flexible printed circuit board, a printed circuit board, or a chip on film.

Figure 3:
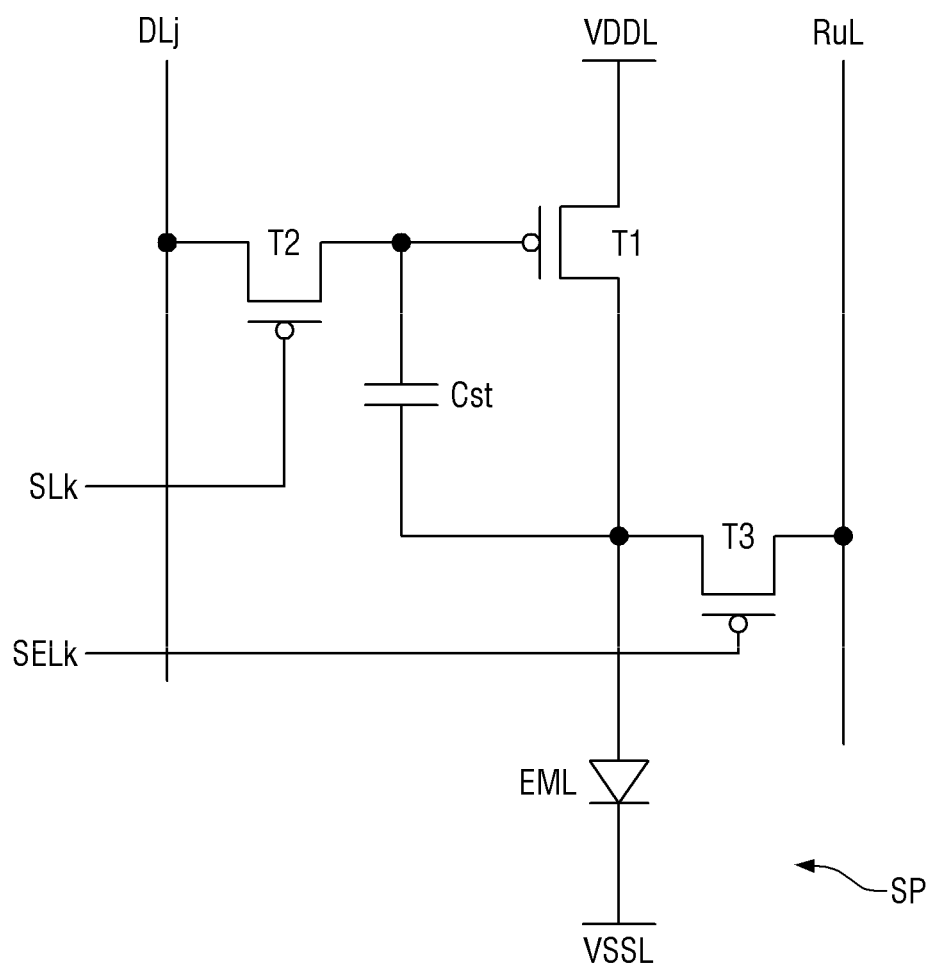
FIG. 3 is a circuit diagram illustrating an example of the pixel of FIG. 2.

FIG. 3 is a circuit diagram illustrating an example of the pixel of FIG. 2.

FIG. 3 illustrates the pixel PX connected to a $k^{th}$ scan line SLk, a $k^{th}$ sensing signal line SELk, a reference voltage line RuL, and a $j^{th}$ data line DLj.

Referring to FIG. 3, the pixel PX may overlap the $k^{th}$ scan line SLk, the $k^{th}$ sensing signal line SELk, the reference voltage line RuL, and the $j^{th}$ data line DLj. In addition, the pixel PX may be connected to the first driving voltage line VDDL to which the first driving voltage is applied, an initialization voltage line VIL to which an initialization voltage is applied, and a second driving voltage line VSSL to which a second driving voltage lower than the first driving voltage is applied.

The pixel PX includes a driving transistor, a light emitting element, switching transistors, and a first capacitor Cst. For example, the pixel PX may include a first transistor T1 as the driving transistor, and second and third transistors T2 and T3 as the switch elements. However, the pixel PX of the present disclosure is not limited to that shown in FIG. 3.

The first transistor T1 may include a first gate electrode, a first source electrode, and a first drain electrode. The first transistor T1 controls a drain-source current Ids (hereinafter, referred to as "driving current") based on a data voltage applied to the first gate electrode. The driving current Ids flowing through a channel of the first transistor T1 is proportional to the square of the difference between a threshold voltage and a voltage Vgs between the first gate electrode and the first source electrode of the first transistor T1, as shown in Eq. 1.

$$Ids = k' \times (Vgs - Vth)^2 \qquad \text{Eq. 1}$$

In Eq. 1, k' is a proportional coefficient determined by the structure and physical characteristics of the first transistor T1, Vgs is a gate-source voltage of the first transistor T1, and Vth is a threshold voltage of the first transistor T1.

A light emitting element EML emits light in proportional to an amount of current flowing through the light emitting element EML, the driving current Ids. The light emitting element EML may be an organic light emitting diode including a first electrode, a second electrode, and an organic light emitting layer disposed between the first electrode and the second electrode. Alternatively, the light emitting element EML may be an inorganic light emitting element including a first electrode, a second electrode, and an inorganic semiconductor disposed between the first electrode and the second electrode. Alternatively, the light emitting element EML may be a quantum dot light emitting element including a first electrode, a second electrode, and a quantum dot light emitting layer disposed between the first electrode and the second electrode. Alternatively, the light emitting element EML may be a micro light emitting diode.

The first electrode of the light emitting element EML (anode) may be connected to the second electrode of the first transistor T1, and the second electrode thereof (cathode) may be connected to the second driving voltage line VSSL. A parasitic capacitance may be formed between the anode electrode and the cathode electrode of the light emitting element EML.

The second transistor T2 is turned on in response to a scan signal of the $k^{th}$ scan line SLk to connect the first gate electrode of the first transistor T1 to the $j^{th}$ data line DLj. The second transistor T2 may include a second gate electrode, a second source electrode, and a second drain electrode. The second gate electrode may be connected to the $k^{th}$ scan line SLk, the second source electrode may be connected to the first gate electrode of the first transistor T1, and the second drain electrode may be connected to the $j^{th}$ data line DLj.

The third transistor T3 is turned on in response to a $k^{th}$ sensing signal of the $k^{th}$ sensing signal line SELk to connect the reference voltage line RuL to the first source electrode of the first transistor T1.

The third transistor T3 may include the third gate electrode, the third source electrode, and the third drain electrode. The third gate electrode of the third transistor may be connected to the $k^{th}$ sensing signal line SELk; the third source electrode of the third transistor T3 may be connected to the reference voltage line RuL; and the third drain electrode of the third transistor T3 may be connected to the source electrode of the first transistor T1.

The first capacitor Cst may be formed between the first gate electrode of the first transistor T1 and the first electrode of the light emitting element EML. One electrode of the first capacitor Cst may be connected to the first gate electrode of the first transistor T1, and the other electrode of the capacitor Cst may be connected to the first electrode of the light emitting element EML.

An active layer of each of the first to third transistors T1, T2, and T3 may be made of an oxide semiconductor including indium (In), gallium (Ga), and oxygen (O).

Further, in FIG. 3, each of the first to third transistors T1, T2, and T3 is mainly described as being formed of an p-type MOSFET (metal oxide semiconductor field effect transistor), but is not limited thereto, and may be formed of a n-type MOSFET.

Figure 4A:
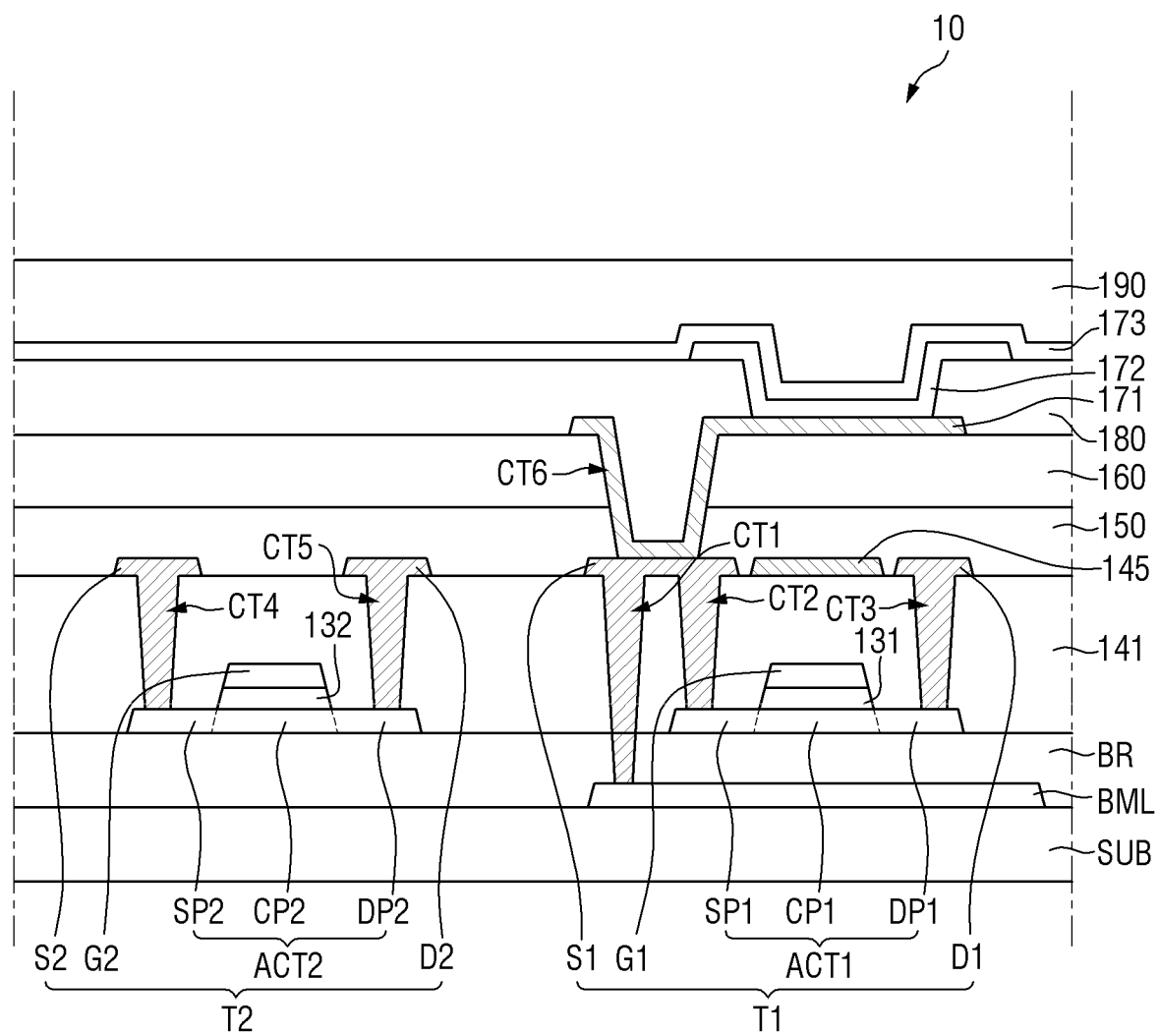
FIG. 4A is a cross-sectional view illustrating an example of the first transistor and the second transistor of FIG. 3.

FIG. 4A is a cross-sectional view illustrating an example of the first transistor and the second transistor of FIG. 3.

Referring to FIG. 4A, the substrate SUB may be a rigid substrate or a flexible substrate which can be bent, folded or rolled. The substrate SUB may be formed of an insulating material such as glass, quartz, or a polymer resin.

The first transistor T1 and the second transistor T2 may be formed on the substrate SUB. The first transistor T1 may include a first active layer ACT1, a first gate electrode G1, a first source electrode S1, and a first drain electrode D1. The second transistor T2 may include a second active layer ACT2, a second gate electrode G2, a second source electrode S2, and a second drain electrode D2.

Meanwhile, the display device 10 according to an embodiment may further include a light blocking layer BML disposed below the first transistor to overlap at least the first active layer ACT1 of the first transistor T1 in a plan view.

The light blocking layer BML may be disposed to completely overlap the first active layer ACT1. The light blocking layer BML may prevent light incident from the substrate SUB from entering into a first channel region CP1 of the first active layer ACT1. Therefore, it is possible to prevent a leakage current due to light incident onto the first active layer ACT1 from flowing in the first channel region CP1 of the first active layer ACT1. The light blocking layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The light-blocking layer BML may overlap the first transistor T1 that is the driving transistor, but may not overlap the second transistor T2 that is the switching transistor. In the case of the switching transistor, it is preferable to minimize a parasitic capacitance formed between conductors in the display panel 100 in order to ensure a fast driving charging rate. On the other hand, in the case of the driving transistor, it is preferable to increase a driving range. Therefore, the light blocking layer BML may be designed to overlap the first transistor T1 without overlapping the second transistor T2.

A barrier layer BR may be formed on the substrate SUB and the light blocking layer BML. The barrier layer BR may be in direct contact with the substrate SUB, the light blocking layer BML, and the active layers ACT1 and ACT2.

A hydrogen concentration of the barrier layer BR may be lower than that of a second interlayer insulating layer 145 to be described later. In accordance with the display device 10 of the present embodiment, the hydrogen concentration of the barrier layer BR is lower than that of the second interlayer insulating layer 145, so that the concentration of hydrogen diffused into the second active layer ACT2 can be minimized.

Accordingly, it is possible to prevent a large amount of hydrogen from diffused into the second active layer ACT2 which can prevent a short circuit between a second source region SP2 and a second drain region DP2.

The active layers ACT1 and ACT2 may be disposed on the barrier layer BR. The first transistor T1 may include the first active layer ACT1, and the second transistor T2 may include the second active layer ACT2.

The first active layer ACT1 may include the first channel region CP1, a first source region SP1 disposed at one side of the first channel region CP1, and a first drain region DP1 disposed at the other side of the first channel region CP1. The second active layer ACT2 may include the second channel region CP2, a second source region SP2 disposed at one side of the second channel region CP2, and a second drain region DP2 disposed at the other side of the second channel region CP2.

Each of the active layers ACT1 and ACT2 may be made of an oxide semiconductor including indium (In), gallium (Ga), and oxygen (O). For example, the active layers ACT1 and ACT2 may be made of IGZO (indium (In), gallium (Ga), zinc (Zn) and oxygen (O)), IGZTO (indium (In), gallium (Ga), zinc (Zn), tin (Sn) and oxygen (O)), or IGTO (indium (In), gallium (Ga), tin (Sn) and oxygen (O)).

Gate insulating layers 131 and 132 may be formed on the first active layer ACT1 and the second active layer ACT2, respectively. The gate insulating layers 131 and 132 may include a first gate insulating layer 131 disposed on a partial region of the first active layer ACT1 and a second gate insulating layer 132 disposed on a partial region of the second active layer ACT2. The first gate insulating layer 131 and the second gate insulating layer 132 may be made of the same material and may be formed on the same layer through the same process. The gate insulating layers 131 and 132 may be formed of an inorganic layer, e.g., silicon oxide.

The gate insulating layers 131 and 132 may overlap the channel regions CP1 and CP2 of the active layers ACT1 and ACT2, respectively.

Hydrogen concentrations of the gate insulating layers 131 and 132 may be lower than that of the second interlayer insulating layer 145 to be described later. For example, the gate insulating layers 131 and 132 may contain silicon oxide. In another example, the gate insulating layers 131 and 132 may contain silicon oxynitride.

The gate electrodes G1 and G2 may be disposed on the gate insulating layers 131 and 132, respectively. The gate electrodes G1 and G2 may include the first gate electrode G1 disposed on the first gate insulating layer 131 and the second gate electrode G2 disposed on the second gate insulating layer 132. The first gate electrode G1 may overlap the first channel region CP1 of the first active layer ACT1, and the second gate electrode G2 may overlap the second channel region CP2 of the second active layer ACT2. Side surfaces of the gate electrodes G1 and G2 may be aligned with side surfaces of the gate insulating layers 131 and 132 in a thickness direction.

The gate electrodes G1 and G2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

An interlayer insulating layer may be disposed on the gate electrodes G1 and G2. The interlayer insulating layer may include a first interlayer insulating layer 141, and the second interlayer insulating layer 145 disposed on the first interlayer insulating layer 141.

The first interlayer insulating layer 141 may be disposed on the barrier layer BR, the active layers ACT1 and ACT2, the gate insulating layers 131 and 132, and the gate electrodes G1 and G2.

The first interlayer insulating layer 141 may be formed of an inorganic layer, e.g., silicon oxide, silicon nitride, silicon oxynitride, titanium oxide, or aluminum oxide.

In one embodiment, the first interlayer insulating layer 141 may contain silicon oxynitride. In some embodiments, the first interlayer insulating layer 141 may contain silicon oxide.

The first interlayer insulating layer 141 may be deposited by a display device manufacturing method to be described later, and then subjected to heat treatment to supply hydrogen to the source/drain regions SP1, SP2, DP1, and DP2 of the active layers ACT1 and ACT2. During heat treatment, hydrogen atoms included in the first interlayer insulating layer 141 may be diffused into the source/drain regions SP1, SP2, DP1, and DP2 of the active layers ACT1 and ACT2 to make the source/drain regions SP1, SP2, DP1, and DP2 of the active layers ACT1 and ACT2 conductive (e.g., to form n+ source/drain regions).

The hydrogen concentration of the first interlayer insulating layer 141 may be lower than that of the second interlayer insulating layer 145 to be described later. In other words, the hydrogen concentration of the second interlayer insulating layer 145 may be higher than that of the first interlayer insulating layer 141.

The second interlayer insulating layer 145 may be disposed on the first interlayer insulating layer 141. The second interlayer insulating layer 145 may not overlap the second transistor T2 but overlaps the first transistor T1 in a plan view. The second interlayer insulating layer 145 may overlap the first active layer ACT1 without overlapping the second active layer ACT2.

Meanwhile, in the process of depositing and heat treating the first interlayer insulating layer 141, hydrogen may be diffused into the source/drain regions SP1, SP2, DP1, and DP2 of the active layers ACT1 and ACT2 to make the source/drain regions SP1, SP2, DP1, and DP2 of the active layers ACT1 and ACT2 conductive (e.g., to form n+ source/ drain regions) as described above. A required hydrogen concentration in the source/drain regions of the driving transistor and the switching transistor is different.

More specifically, the required hydrogen centration in the source/drain regions of the second transistor T2 is much lower than that in the source/drain regions of the driving transistor T1. When the hydrogen centration in the source/ drain regions of the second transistor T2 is excessive, the number of carriers may increase and a threshold voltage may shift in a negative direction (negative shift). In other words, when the hydrogen centration in the source/drain regions of the second transistor T2 is excessive, the degree of bonding between the hydrogen in the second active layer ACT2 and oxygen in the second active layer ACT2 may increase. Thus oxygen deficiency may occur in the second active layer ACT2 which may result in poor reliability of the element.

On the other hand, in the case of the first transistor T1 that is the driving transistor, the channel length of the first transistor T1 may be designed to be longer than that of the second transistor T2 in order to suppress fluctuations in the threshold voltage However, when the hydrogen concentration in the first active layer ACT1 which serves as a carrier is too small, it may be difficult to use the longer channel length in the first transistor T1 because current flowing through a channel of the first transistor T1 may become less than required.

Further, when the concentration of hydrogen in the first active layer ACT1 is small, the amount of electron traps in the first active layer ACT1 may increase due to an excessive amount of oxygen in the first active layer ACT1, which may result in deterioration of characteristics of the driving transistor or the like.

In order to improve the above-described element characteristics of the driving transistor and the switching transistor, it is necessary to differently control the amount of hydrogen in the active layers ACT1 and ACT2. Therefore, the second interlayer insulating layer 145 overlapping only the first transistor T1 may be considered.

The second interlayer insulating layer 145 may be selectively applied on the first transistor T1.

The first interlayer insulating layer 141 and the second interlayer insulating layer 145 may have different hydrogen concentrations. In one embodiment, the hydrogen concentration of the second interlayer insulating layer 145 may be higher than that of the first interlayer insulating layer 141. Since the hydrogen concentration of the second interlayer insulating layer 145 is higher than that of the first interlayer insulating layer 141, the amount of hydrogen diffused into the source/drain regions SP1 and DP1 of the first active layer ACT1 may increase.

Accordingly, in the case of the second transistor T2, it is possible to prevent the deterioration of the element reliability due to excessive carriers and the threshold voltage shift in the negative direction caused by the excessive amount of hydrogen. Further, in the case of the first transistor T1, it is possible to ensure the driving range by increasing the channel length of the first transistor T1, and also possible to prevent in advance the deterioration of the element characteristics due to an excessive amount of oxygen in the first active layer ACT1.

The first interlayer insulating layer 141 and the second interlayer insulating layer 145 may have different hydrogen concentrations because the first interlayer insulating layer 141 and the second interlayer insulating layer 145 are made of different materials or made using different process conditions.

In one embodiment, the second interlayer insulating layer 145 may contain silicon nitride, and the first interlayer insulating layer 141 may contain silicon oxynitride.

In some embodiments, the second interlayer insulating layer 145 may contain silicon oxynitride, and the first interlayer insulating layer 141 may contain silicon oxide.

For example, the hydrogen concentration of the first interlayer insulating layer 141 may be about $10^{21}$ (numbers/cm$^3$) or less, and the hydrogen concentration of the second interlayer insulating layer 145 may be about 2 to 100 times higher than that of the first interlayer insulating layer 141. For example, the hydrogen concentration of the second interlayer insulating layer 145 may be higher than about $10^{21}$ (number/cm$^3$).

Specific hydrogen concentrations of the first interlayer insulating layer 141 and the second interlayer insulating layer 145 are illustrated in FIGS. 6 and 7.

FIGS. 6 and 7 are tables showing the materials and the hydrogen concentrations of the first interlayer insulating layer and the second interlayer insulating layer.

FIG. 6 illustrates that silicon oxynitride is applied as a material of the first interlayer insulating layer 141 and silicon nitride is applied as a material of the second interlayer insulating layer 145. FIG. 7 illustrates that silicon oxide is applied as a material of the insulating layer 141 and silicon oxynitride is applied as a material of the second interlayer insulating layer 145.

In accordance with one embodiment, the second interlayer insulating layer 145 may be spaced apart from the first source electrode S1 and the first drain electrode D1 that are adjacent thereto.

Figure 4B:
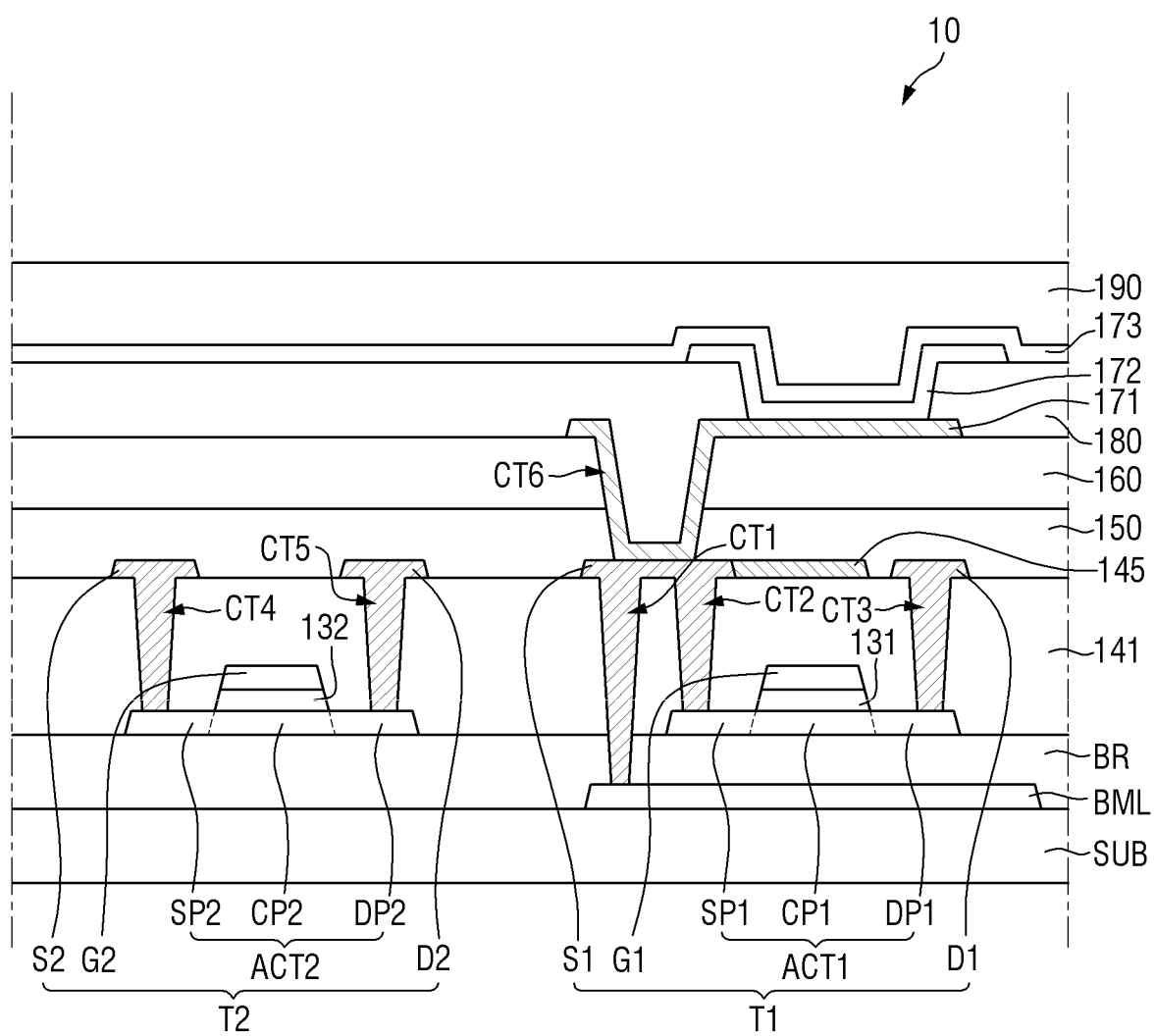
FIG. 4B is a cross-sectional view showing the first transistor and the second transistor of FIG. 3 according to an embodiment.
Figure 4C:
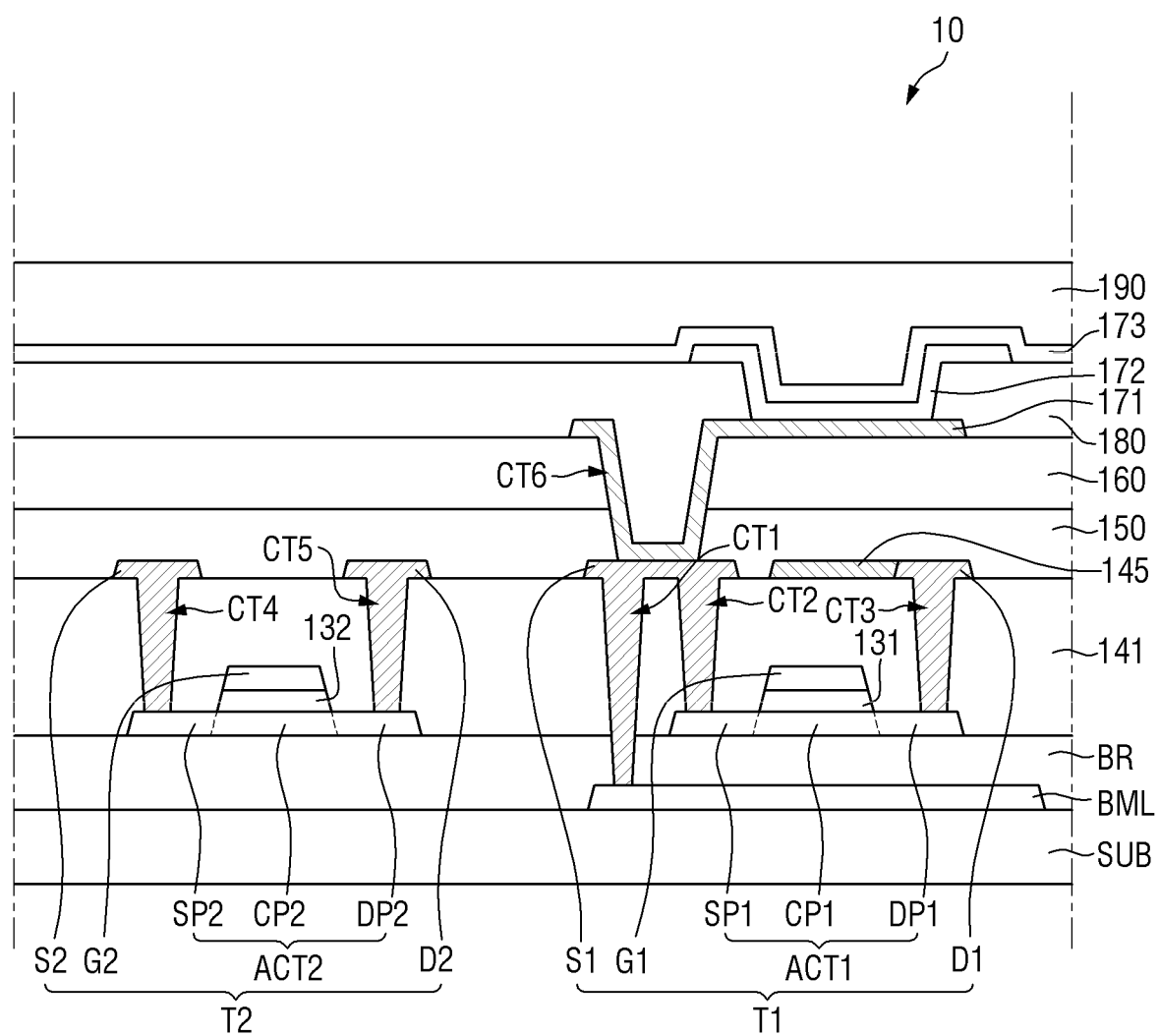
FIG. 4C is a cross-sectional view showing the first transistor and the second transistor of FIG. 3 according to an embodiment.
Figure 4D:
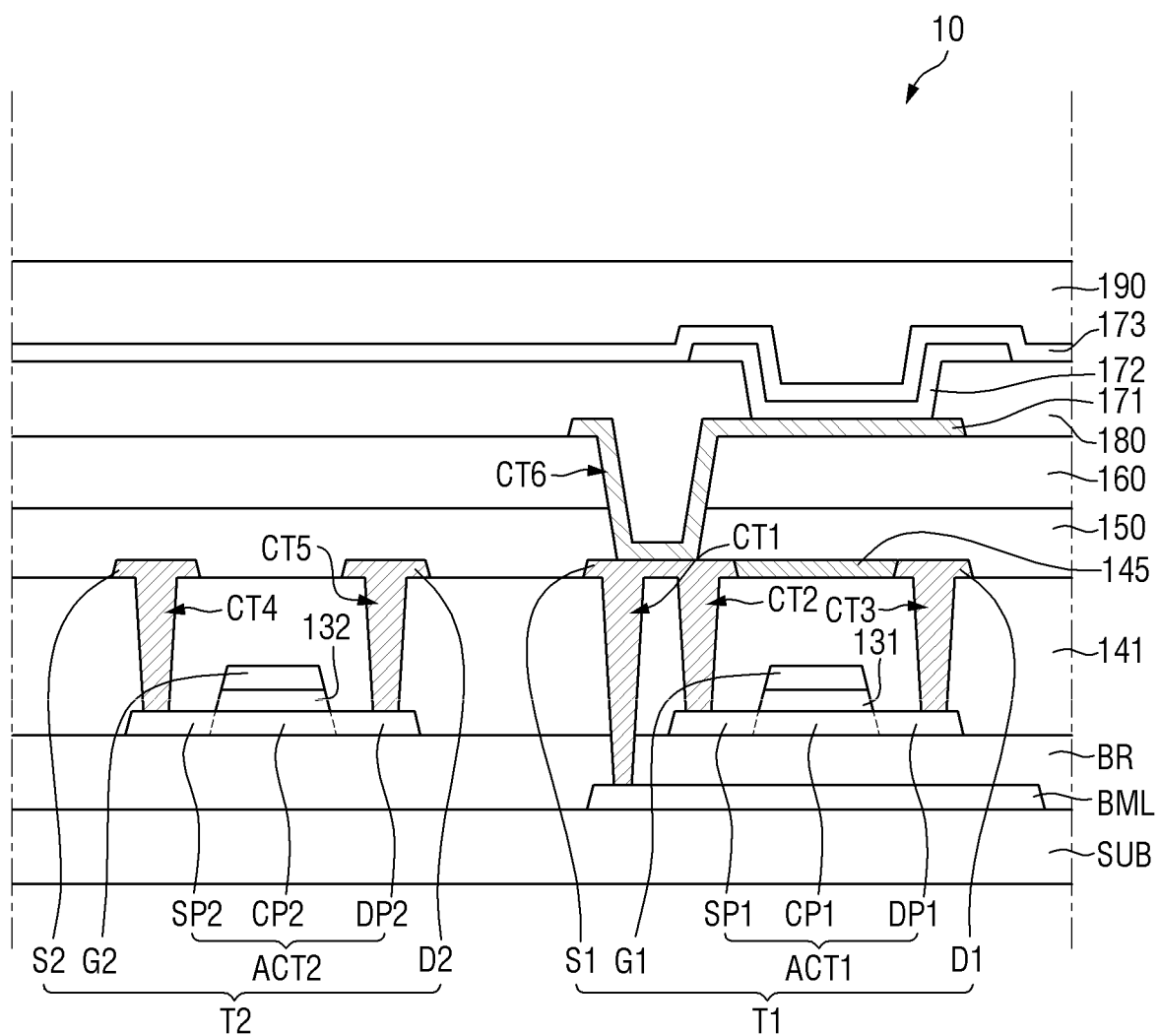
FIG. 4D is a cross-sectional view showing the first transistor and the second transistor of FIG. 3 according to an embodiment.

FIG. 4B is a cross-sectional view showing the first transistor and the second transistor of FIG. 3 according to an embodiment. FIG. 4C is a cross-sectional view showing the first transistor and the second transistor of FIG. 3 according to an embodiment. FIG. 4D is a cross-sectional view showing the first transistor and the second transistor of FIG. 3 according to an embodiment.

As shown in FIG. 4B, the second interlayer insulating layer 145 may be in direct contact with the first source electrode S1 adjacent thereto while being spaced apart from the first drain electrode D1.

As shown in FIG. 4C, the second interlayer insulating layer 145 may be spaced apart from the first source electrode S1 adjacent thereto while being in direct contact with the first drain electrode D1.

As shown in FIG. 4D, the second interlayer insulating layer 145 may be in direct contact with the first source electrode S1 and first drain electrode D1 that are adjacent thereto.

Figure 5:
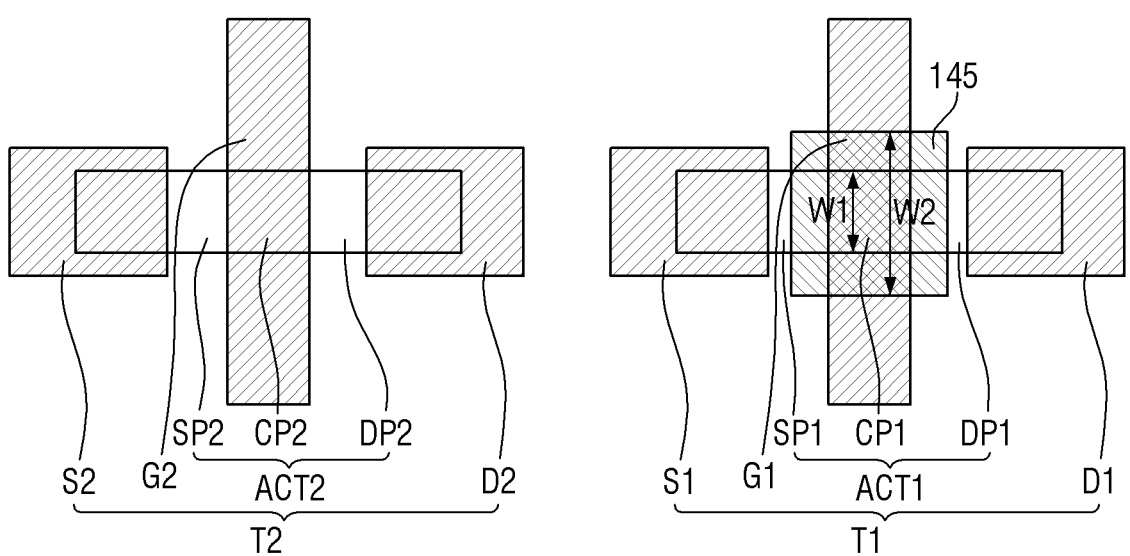
FIG. 5 is a schematic plan view of the first transistor and the second transistor according to an embodiment.

FIG. 5 is a schematic plan view of the first transistor and the second transistor according to an embodiment.

Referring to FIG. 5, in one embodiment, the first active layer ACT1 may have a first width W1 in a plan view and the second interlayer insulating layer 145 may have a second width W2 in a plan view. The second width W2 may be greater than the first width W1.

In accordance with one embodiment, the second width W2 is greater than the first width W1 so that the second interlayer insulating layer 145 can completely cover the first active layer ACT1 in the width direction.

Referring back to FIGS. 4A-4D, the first source electrode S1, the first drain electrode D1, and the second source electrode S2, and the second drain electrode D2 may be formed on the first interlayer insulating layer 141 and the second interlayer insulating layer 145. The first source electrode S1, the first drain electrode D1, the second source electrode S2, and the second drain electrode D2 may be formed as a single layer or multiple layers made of any one of molybdenum (Mo), aluminum (Al), and chromium (Cr), gold (Au), titanium (Ti), nickel (Ni), neodymium (Nd) and copper (Cu) or an alloy thereof.

A first contact hole CT1 may be a hole that penetrates through the first interlayer insulating layer 141 and the barrier layer BR to expose the light blocking layer BML. The first source electrode S1 may be connected to the light blocking layer BML via the first contact hole CT1.

A second contact hole CT2 may be a hole that penetrates through the first interlayer insulating layer 141 to expose the first source region SP1 of the first active layer ACT1. The first source electrode S1 may be connected to the first source region SP1 via the second contact hole CT2.

A third contact hole CT2 may be a hole that penetrates through the first interlayer insulating layer 141 to expose the first drain region DP1 of the first active layer ACT1. The first drain electrode D1 may be connected to the first drain region DP1 via the third contact hole CT3.

A fourth contact hole CT4 may be a hole that penetrates through the first interlayer insulating layer 141 to expose the second source region SP2 of the second active layer ACT2. The second source electrode S2 may be connected to the second source region SP2 via the fourth contact hole CT4.

A fifth contact hole CT5 may be a hole that penetrates through the first interlayer insulating layer 141 to expose the second drain region DP2 of the second active layer ACT2. The second drain electrode D2 may be connected to the second drain region DP2 via the fifth contact hole CT5.

In some embodiments, the first source electrode S1 may not be connected to the light blocking layer BML, and the first gate electrode G1 may be connected to the light blocking layer BML.

A passivation layer 150 may be formed on the first source electrode S1, the first drain electrode D1, the second source electrode S2, and the second drain electrode D2. The passivation layer 150 may be formed of an inorganic layer, e.g., silicon oxide, silicon nitride, silicon oxynitride, titanium oxide, or aluminum oxide.

A planarization layer 160 may be formed on the passivation layer 150 to flatten the height difference due to the first transistor T1 and the second transistor T2. The planarization layer 160 may be formed of an organic layer such as acryl resin, epoxy resin, phenolic resin, polyamide resin, polyimide resin and the like.

FIG. 4 illustrates the first transistor T1 and the second transistor T2 having a top gate structure, but the present disclosure is not limited thereto. That is, the first transistor T1 and the second transistor T2 may have a bottom gate structure in which the gate electrode is positioned under the active layer or by a double gate method in which the gate electrode is positioned both above and below the active layer.

A first electrode 171 and a pixel defining layer 180 of the light emitting element EML are formed on the planarization layer 160.

A sixth contact hole CT6 may be formed to penetrate through the planarization layer 160 and the passivation layer 150 to expose the first source electrode S1. The first electrode 171 may be connected to the first source electrode S1 via the sixth contact hole CT6. In a top emission structure in which light is emitted toward the second electrode 173 when viewed with respect to the light emitting layer 172, the first electrode 171 may be made of a metal having high reflectivity. For example, the first electrode 171 may be formed of a metal such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy is an alloy of silver (Ag), palladium (Pd) and copper (Cu). Alternatively, the first electrode 171 may be formed of a single layer of molybdenum (Mo), titanium (Ti), copper (Cu), or aluminum (Al).

The pixel defining layer 180 may be formed to partition the first electrode 171 on the planarization layer 160 to define an emission area of each of the pixels PX. To this end, the pixel defining layer 180 may be formed to cover edges of the first electrode 171. The emission area of each of the pixels PX represents a region in which the first electrode 171, the light emitting layer 172, and the second electrode 173 are sequentially stacked and holes from the first electrode 171 and electrons from the second electrode 173 are coupled to each other in the light emitting layer 172 to emit light. The pixel defining layer 180 may be formed of an organic layer such as acryl resin, epoxy resin, phenolic resin, polyamide resin, polyimide resin and the like.

The light emitting layer 172 may be disposed on the first electrode 171 and the pixel defining layer 180. The light emitting layer 172 may include an organic material to emit light in a predetermined color. For example, the light emitting layer 172 may include a hole transporting layer, an organic material layer, and an electron transporting layer.

The second electrode 173 is formed on the light emitting layer 172. The second electrode 173 may be formed to cover the light emitting layer 172. The second electrode 173 may be a common layer commonly formed in the pixels PX. A capping layer may be formed on the second electrode 173.

In the top emission structure, the second electrode 173 may be formed of a transparent conductive material (TCO) such as ITO or IZO capable of transmitting light or a semi-transmissive conductive material such as magnesium (Mg), silver (Ag), or an alloy of magnesium (Mg) and silver (Ag). When the second electrode 173 is formed of a semi-transmissive metal, the light emission efficiency can be increased due to a micro-cavity effect.

An encapsulation layer 190 may be formed on the second electrode 173. The encapsulation layer 190 may include at least one inorganic layer to prevent oxygen or moisture from permeating into the light emitting layer 172 and the second electrode 173. In addition, the encapsulation layer 190 may include at least one organic layer to protect the light emitting layer 172 from foreign substances such as dust.

Alternatively, instead of the encapsulation layer 190, a substrate may be disposed on the second electrode 173, and a space between the second electrode 173 and the substrate may be in a vacuum state, or a filling film may be disposed therein. The filling film may be an epoxy filling film or a silicon filling film.

As described above, in the case of the second transistor T2 that is the switching transistor, when the concentration of hydrogen is excessive, the number of carriers may increase and a threshold voltage may be shifted in a negative direction (negative shift). In other words, when the concentration of hydrogen is excessive, the degree of bonding between the hydrogen in the second active layer ACT2 and oxygen in the second active layer ACT2 may increase. Thus oxygen deficiency may occur in the second active layer ACT2 which may result in poor reliability of the element.

On the other hand, in the case of the first transistor T1 that is the driving transistor, the channel length of the first transistor t1 may be designed to be longer than that of the second transistor T2 in order to suppress fluctuations in the threshold voltage. However, when the hydrogen concentration in the first active layer ACT1 which serves as a carrier is too small, it may be difficult to use the longer channel length in the first transistor T1 because current flowing through a channel of the first transistor T1 may become less than required.

Further, when the concentration of hydrogen in the first active layer ACT1 is small, the amount of electron traps in the first active layer ACT1 may increase due to an excessive amount of oxygen in the first active layer ACT1, which may result in deterioration of characteristics of the driving transistor or the like.

However, in accordance with the present embodiment, it is possible to differently control the amount of hydrogen in the respective active layers ACT1 and ACT2 by selectively applying the second interlayer insulating layer 145 on the first transistor T1 in order to improve the characteristics of the driving transistor and the switching transistor.

Further, as will be described later in a method for manufacturing a display device, the second interlayer insulating layer 145 is formed using an existing mask, so that a manufacturing cost and a processing time can be significantly reduced.

Hereinafter, a method of manufacturing the display device 1 according to an exemplary embodiment will be described. In the following embodiment, the same components as those of the above-described embodiment are denoted by the same reference numerals, and a description thereof will be omitted or simplified.

Figure 8:
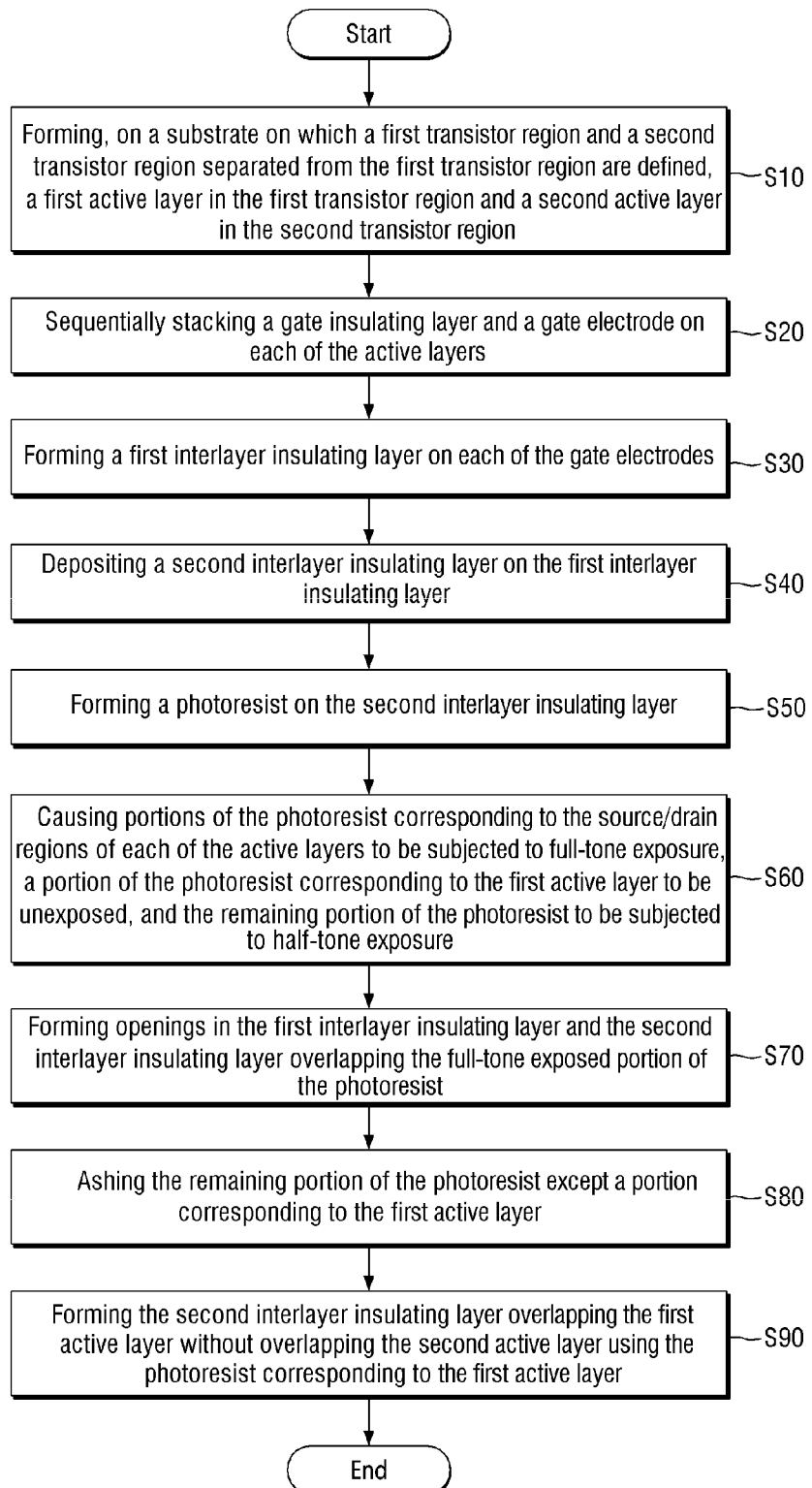
FIG. 8 is a flowchart of a method of fabricating a display device according to an exemplary embodiment.

FIG. 8 is a flowchart of a method of fabricating a display device according to an exemplary embodiment. FIGS. 9 to 14 are cross-sectional views showing the steps of a method for manufacturing a display device according to an exemplary embodiment.

Figure 9:
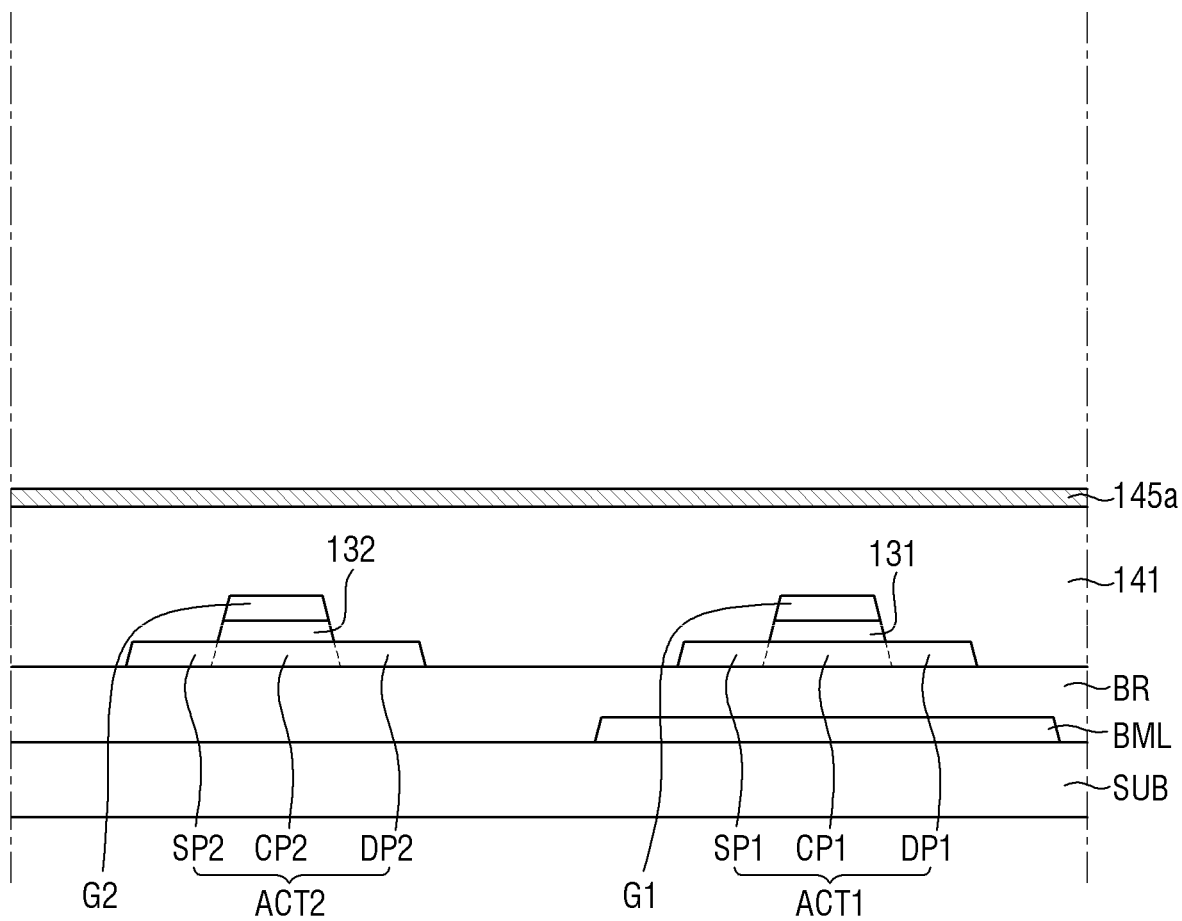
FIGS. 9, 10, 11, 12, 13 and 14 are cross-sectional views showing the steps of a method for manufacturing a display device according to an exemplary embodiment.

Referring to FIGS. 8 and 9, on a substrate SUB in which a first transistor region and a second transistor region separated from the first transistor region are defined, a first active layer ACT1 is formed in the first transistor region and a second active layer ACT2 is formed in the second transistor region (step S10).

More specifically, first, the substrate SUB which includes the first transistor region and the second transistor region separated from the first transistor region is prepared.

The substrate SUB may be a rigid substrate or a flexible substrate which can be bent, folded or rolled. The substrate SUB may be formed of an insulating material such as glass, quartz, or a polymer resin.

The first transistor region may be a region where the first transistor T1 described with reference to FIG. 4 is to be disposed, and the second transistor region may be a region where the second transistor T2 described with reference to FIG. 4 is to be disposed.

Then, a light blocking layer BML is disposed on the substrate SUB.

The light blocking layer BML may be disposed to overlap the first active layer ACT1 to be described later. The light blocking layer BML may prevent light incident onto a first channel region CP1 of the first active layer ACT1. Therefore, it is possible to prevent a leakage current due to light incident onto the first active layer ACT1 from flowing in the first channel region CP1 of the first active layer ACT1. The light blocking layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The light-blocking layer BML may overlap the first transistor T1 that is the driving transistor, but may not overlap the second transistor T2 that is the switching transistor. In the case of the switching transistor, it is preferable to minimize a parasitic capacitance formed between conductors in the display panel 100 in order to ensure a fast driving charging rate. On the other hand, in the case of the driving transistor, it is preferable to increase a driving range. Therefore, the light blocking layer BML may be designed to overlap the first transistor T1 without overlapping the second transistor T2.

Subsequently, a barrier layer BR is formed on the light blocking layer BML and the substrate SUB.

The barrier layer BR may be in direct contact with the substrate SUB, the light blocking layer BML, and the active layers ACT1 and ACT2 to be described later.

A hydrogen concentration of the barrier layer BR may be lower than that of a second interlayer insulating layer 145 to be described later. In accordance with the method for manufacturing the display device 10 of the present embodiment, the hydrogen concentration of the barrier layer BR is lower than that of the second interlayer insulating layer 145 so that the concentration of hydrogen diffused into the second active layer ACT2 can be minimized.

Accordingly, it is possible to prevent a large amount of hydrogen from diffused into the second active layer ACT2, which can prevent a short circuit between a second source region SP2 and a second drain region DP2.

Then, the active layers ACT1 and ACT2 are formed.

The active layers ACT1 and ACT2 may be directly formed on the barrier layer BR. The active layers ACT1 and ACT2 may be made of the same material and may be formed on the same layer by the same process.

Each of the active layers ACT1 and ACT2 may be made of an oxide semiconductor including indium (In), gallium (Ga), and oxygen (O). For example, the active layers ACT1 and ACT2 may be made of IGZO (indium (In), gallium (Ga), zinc (Zn) and oxygen (O)), IGZTO (indium (In), gallium (Ga), zinc (Zn), tin (Sn) and oxygen (O)), or IGTO (indium (In), gallium (Ga), tin (Sn) and oxygen (O)).

Next, referring to FIGS. 8 and 9, gate insulating layers 131 and 132 and gate electrodes G1 and G2 are sequentially formed on the active layers ACT1 and ACT2, respectively (step S20).

First, the gate insulating layers 131 and 132 are formed on the first active layer ACT1 and the second active layer ACT2, respectively. The gate insulating layers 131 and 132 may include a first gate insulating layer 131 disposed on a partial region of the first active layer ACT1 and a second gate insulating layer 132 disposed on a partial region of the second active layer ACT2. The first gate insulating layer 131 and the second gate insulating layer 132 may be made of the same material and may be formed on the same layer by the same process. The gate insulating layers 131 and 132 may be formed of an inorganic layer, e.g., silicon oxide.

The gate insulating layers 131 and 132 may be respectively disposed to overlap the channel regions CP1 and CP2 of the active layers ACT1 and ACT2 to be described later.

Hydrogen concentrations of the gate insulating layers 131 and 132 may be lower than that of the second interlayer insulating layer 145 to be described later. For example, the gate insulating layers 131 and 132 may contain silicon oxide. In another example, the gate insulating layers 131 and 132 may contain silicon oxynitride.

Then, the gate electrodes G1 and G2 are arranged on the gate insulating layers 131 and 132, respectively. The gate electrodes G1 and G2 may include the first gate electrode G1 disposed on the first gate insulating layer 131 and the second gate electrode G2 disposed on the second gate insulating layer 132. The first gate electrode G1 may be disposed to overlap the first channel region CP1 (to be described later) of the first active layer ACT1, and the second gate electrode G2 may be disposed to overlap the second channel region CP2 (to be described later) of the second active layer ACT2. Side surfaces of the gate electrodes G1 and G2 may be aligned with side surfaces of the gate insulating layers 131 and 132 in a thickness direction.

The gate electrodes G1 and G2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

Then, referring to FIGS. 8 and 9, a first interlayer insulating layer 141 is formed on the gate electrodes G1 and G2 (step S30).

The first interlayer insulating layer 141 may be formed on the barrier layer BR, the active layers ACT1 and ACT2, the gate insulating layers 131 and 132, and the gate electrodes G1 and G2.

The first interlayer insulating layer 141 may be formed of an inorganic layer, e.g., silicon oxide, silicon nitride, silicon oxynitride, titanium oxide, or aluminum oxide.

In one embodiment, the first interlayer insulating layer 141 may contain silicon oxynitride. In some embodiments, the first interlayer insulating layer 141 may contain silicon oxide.

The first interlayer insulating layer 141 may be deposited by a display device manufacturing method to be described later, and then serve to supply hydrogen to the source/drain regions SP1, SP2, DP1, and DP2 of the active layers ACT1 and ACT2. During heat treatment, hydrogen atoms included in the first interlayer insulating layer 141 may be diffused into the source/drain regions SP1, SP2, DP1, and DP2 of the active layers ACT1 and ACT2 to make the source/drain regions SP1, SP2, DP1, and DP2 of the active layers ACT1 and ACT2 conductive (e.g., to form n+ source/drain regions).

The hydrogen concentration of the first interlayer insulating layer 141 may be lower than that of the second interlayer insulating layer 145 to be described later. In other words, the hydrogen concentration of the second interlayer insulating layer 145 may be higher than that of the first interlayer insulating layer 141.

Meanwhile, in the process of depositing and heat treating the first interlayer insulating layer 141, hydrogen may be diffused into the source/drain regions SP1, SP2, DP1, and DP2 of the active layers ACT1 and ACT2 to make the source/drain regions SP1, SP2, DP1, and DP2 of the active layers ACT1 and ACT2 conductive (e.g., to form n+ source/drain regions) as described above. A required hydrogen concentration in the source/drain regions of the driving transistor and the switching transistor is different. Accordingly, the second interlayer insulating layer 145 may be selectively deposited on the first interlayer insulating layer 141 in a region that requires a high hydrogen concentration.

Then, referring to FIGS. 8 and 9, a second interlayer insulating layer 145a is deposited on the first interlayer insulating layer 141 (step S40).

The first interlayer insulating layer 141 and the second interlayer insulating layer 145a may have different hydrogen concentrations. In one embodiment, the hydrogen concentration of the second interlayer insulating layer 145a may be higher than that of the first interlayer insulating layer 141. Since the hydrogen concentration of the second interlayer insulating layer 145a is higher than that of the first interlayer insulating layer 141, the concentration of hydrogen in the source/drain regions SP1 and DP1 of the first active layer ACT1 may increase.

Accordingly, in the case of the second transistor T2, it is possible to prevent the deterioration of the reliability due to an increase in the number of carriers and the threshold voltage shift in the negative direction caused by the excessive amount of hydrogen. Further, in the case of the first transistor T1, it is possible to ensure the driving range due to an increase in the channel length of the first transistor T1, and also possible to prevent the deterioration of the characteristics of the first transistor T1 due to an excessive amount of oxygen in the first active layer ACT1.

The first interlayer insulating layer 141 and the second interlayer insulating layer 145a may have different hydrogen concentrations because the first interlayer insulating layer 141 and the second interlayer insulating layer 145a are made of different materials or made using different process conditions.

In one embodiment, the second interlayer insulating layer 145a may contain silicon nitride, and the first interlayer insulating layer 141 may contain silicon oxynitride.

In some embodiments, the second interlayer insulating layer 145a may contain silicon oxynitride and the first interlayer insulating layer 141 may contain silicon oxide.

Figure 10:
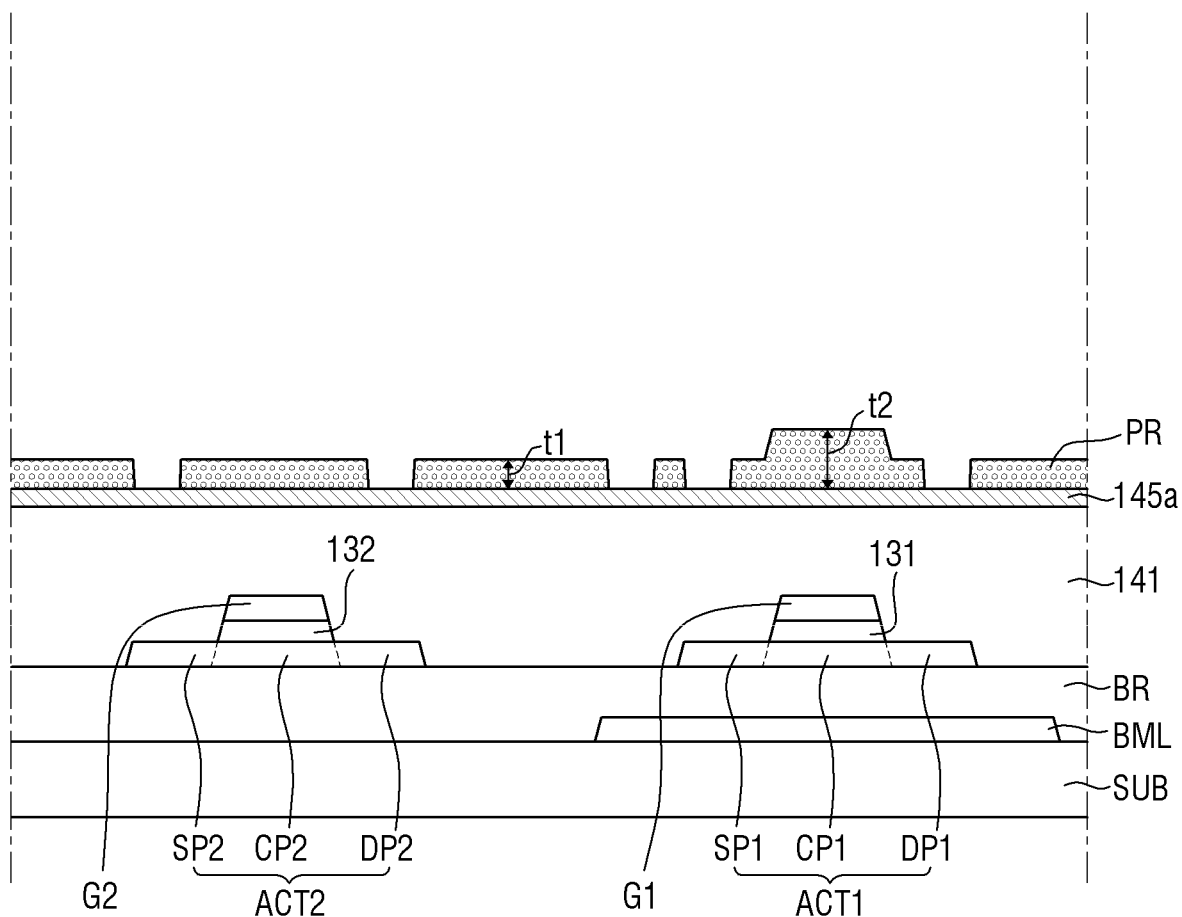

Then, referring to FIGS. 8 and 10, a photoresist PR is formed on the second interlayer insulating layer 145 (step S50).

The photoresist PR may have different thicknesses depending on regions, as shown in FIG. 10. Portions of the photoresist PR corresponding to the first contact hole CT1, the second contact hole CT2, the third contact hole CT3, the fourth contact hole CT4 and the fifth contact hole may be subjected to full-tone exposure to completely develop the photoresist PR in those areas; a portion of the photoresist PR corresponding to the first active layer ACT1 disposed between the second contact hole CT2 and the third contact hole CT3 may be unexposed not to develop the photo resist PR in that area; and the remaining portions of the photoresist PR may be subjected to half-tone exposure to partially developed the photoresist PR in those areas (step S60). The photoresist PR may not be disposed at the full-tone exposed portion. The photoresist PR may have a first thickness t1 at the half-tone exposed portion, and may have a second thickness t2 greater than the first thickness t1 at the unexposed portion.

Figure 11:
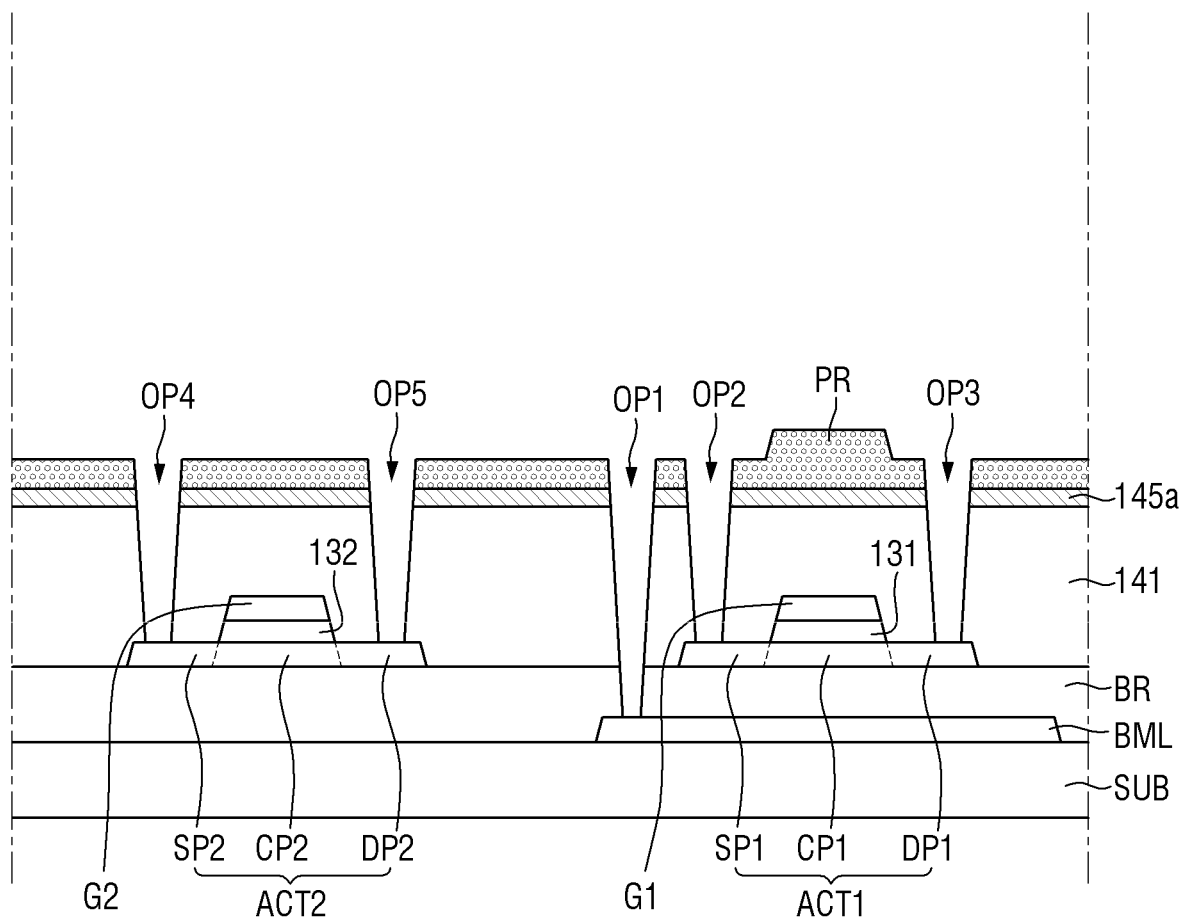

Next, referring to FIGS. 8 and 11, at the full-tone exposed region of the photoresist PR, openings OP1 to OP5 are formed in the first interlayer insulating layer 141 and the second interlayer insulating layer 145 overlapping the full-tone exposed portion of the photoresist PR (step S70).

The positions of the openings OP1 to OP5 may correspond to those of the contact holes CT1 to CT5 of FIG. 4, respectively, except that the openings OP1 to OP5 are not filled with conductive materials.

The openings OP1 to OP5 may be formed by dry etching, but the method of forming the openings OP1 to OP5 are not limited thereto.

Figure 12:
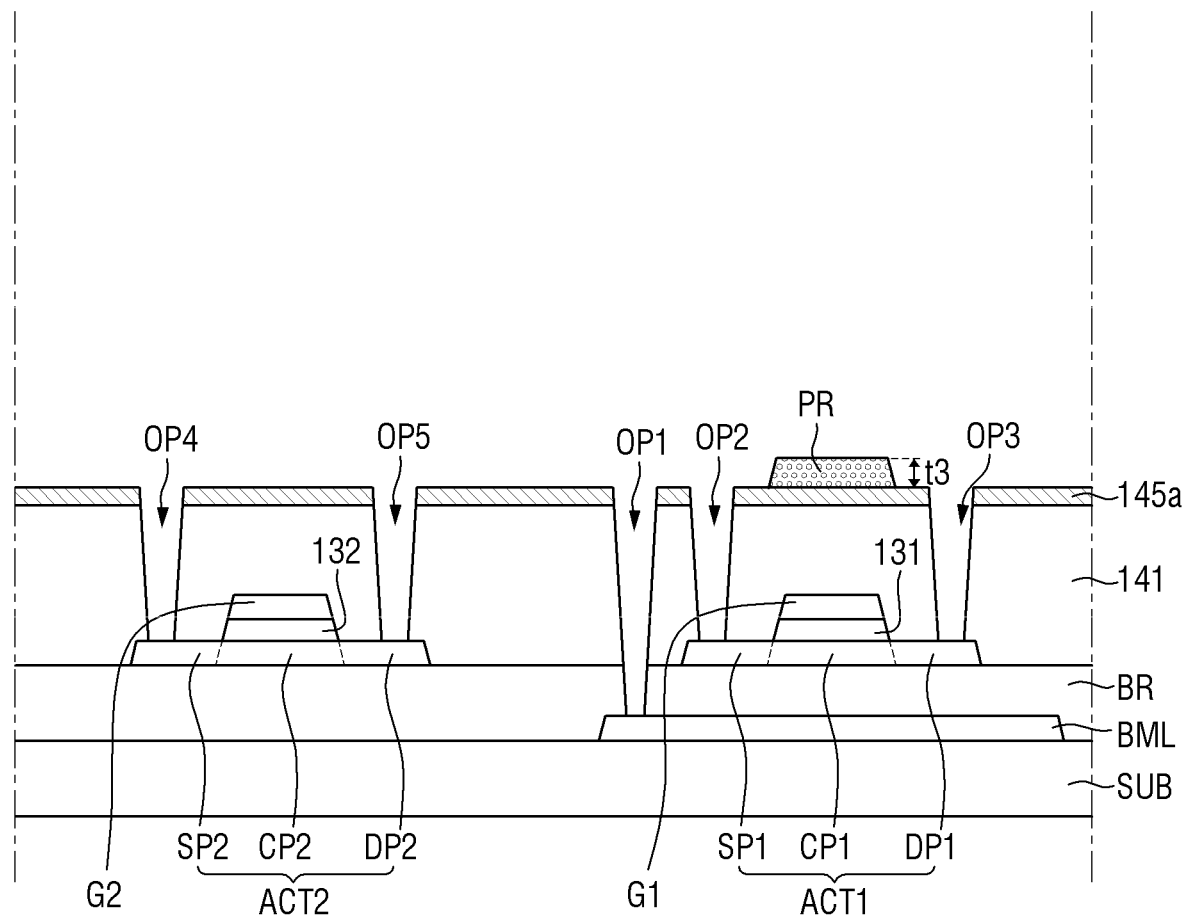

Next, referring to FIGS. 8 and 12, the remaining region of the photoresist PR except the portion corresponding to the first active layer ACT1 disposed between the second contact hole CT2 and the third contact hole CT3 is completely removed by ashing (step S80).

The portion of the photoresist PR corresponding to the first active layer ACT1 disposed between the second contact hole CT2 and the third contact hole CT3 may have a third thickness t3. The third thickness t3 may be smaller than the second thickness t2.

Figure 13:
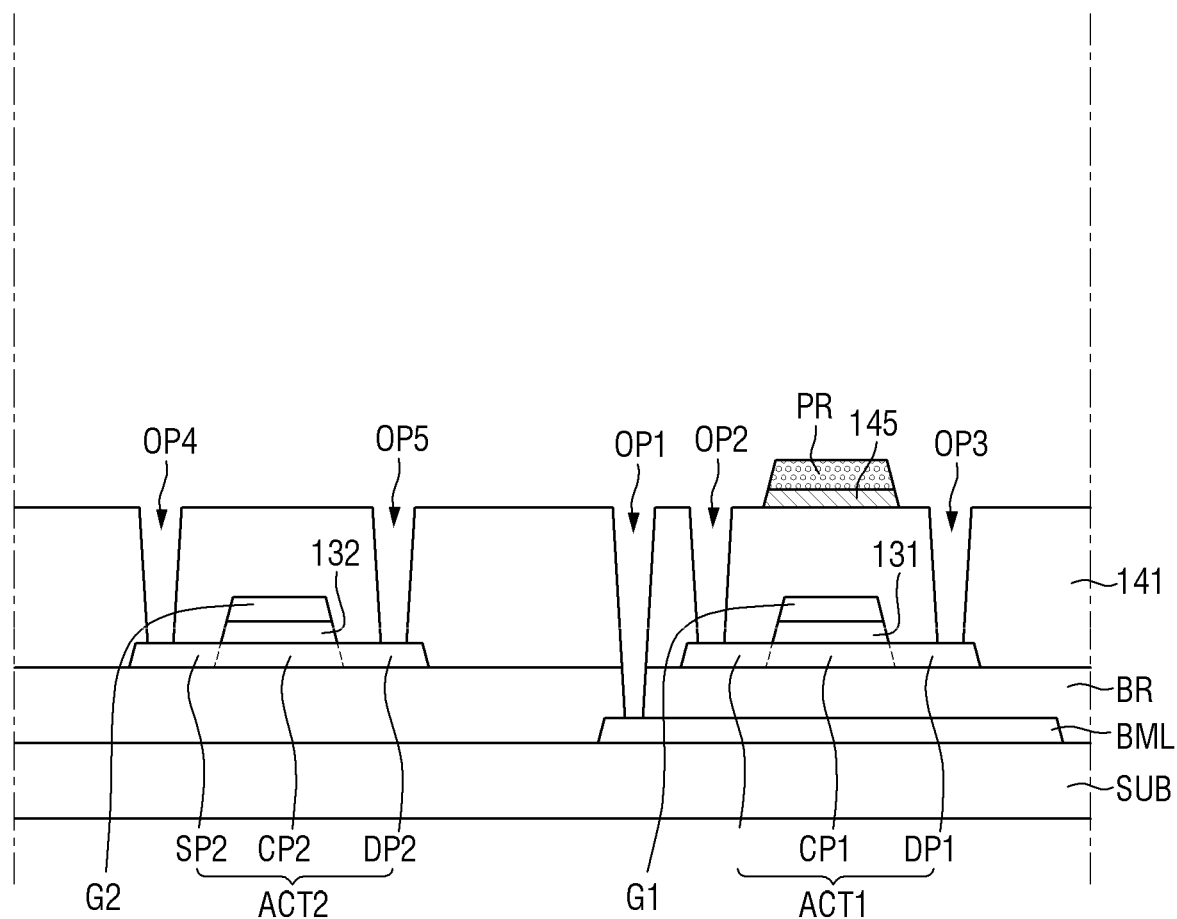

Next, referring to FIGS. 8 and 13, the second interlayer insulating layer (see '145a' in FIG. 12) in the remaining region except the second interlayer insulating layer 145 corresponding to the first active layer ACT1 disposed between the second contact hole CT2 and the third contact hole CT3 is removed using the portion of the photoresist PR corresponding to the first active layer ACT1 disposed between the second contact hole CT2 and the third contact hole CT3 as a mask. Accordingly, it is possible to form the second interlayer insulating layer 145 overlapping the first active layer ACT1 without overlapping the second active layer ACT2 (step S90).

Figure 14:
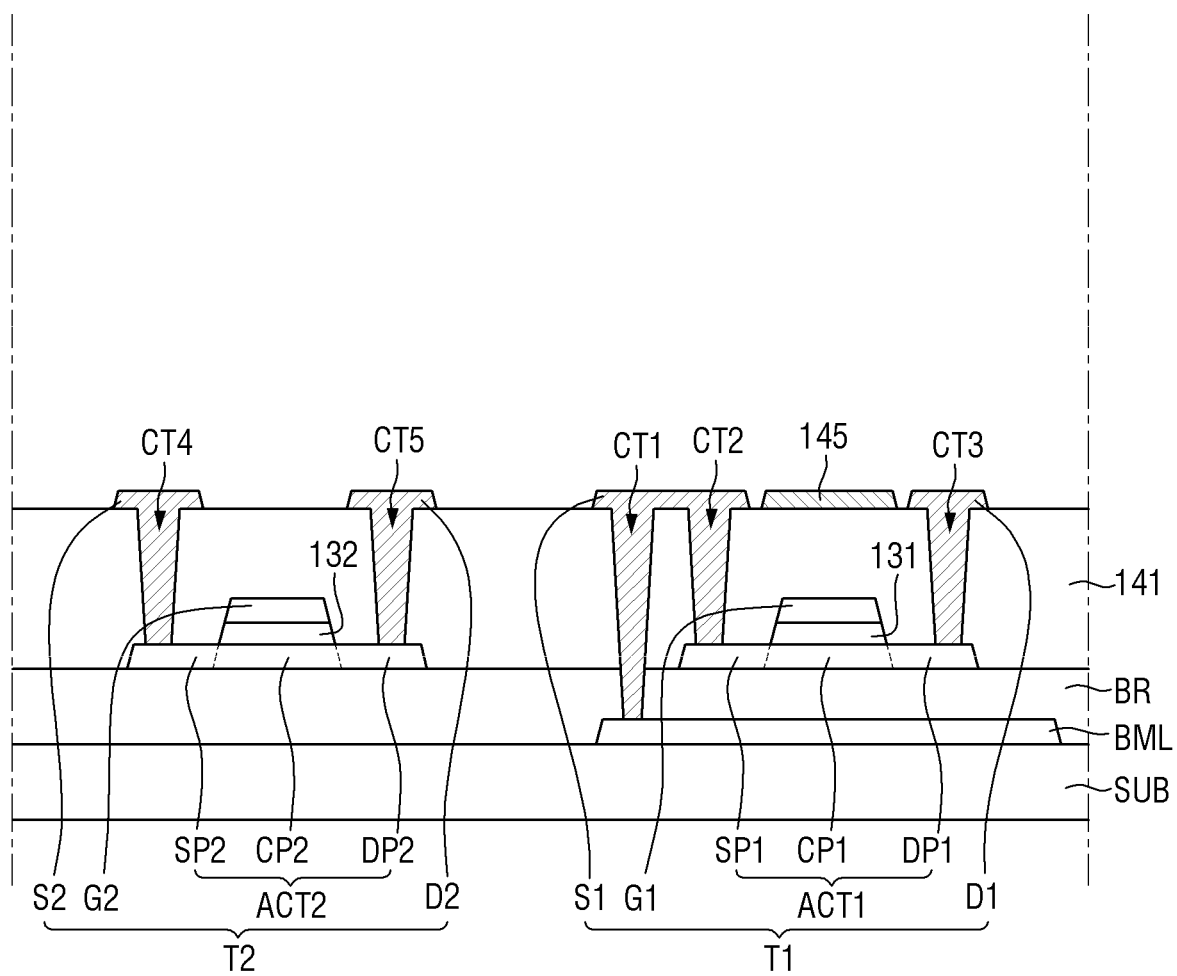

Next, referring to FIGS. 4, 8 and 14, the contact holes CT1 to CT5 described with reference to FIG. 4 are formed, and the source/drain electrodes S1, S2, D1, and D2 are formed. Since the subsequent steps are the same as those described with reference to FIG. 4, a redundant description thereof will be omitted.

In accordance with the present embodiment, the second interlayer insulating layer 145 is selectively formed on the first transistor T1 to improve the characteristics of the driving transistor and the switching transistor which makes it possible to differently control the amount of hydrogen diffused into the active layers ACT1 and ACT2.

Further, the second interlayer insulating layer 145 is formed using the existing mask having the full-tone exposed portion, the unexposed portion, and the half-tone exposed portion so that the manufacturing cost and the processing time can be significantly reduced.

Although embodiments of the inventive concept have been disclosed for illustrative purposes, those skilled in the art will appreciate that various modifications, additions and substitutions are possible, without departing from the scope and spirit of the inventive concept as disclosed in the accompanying claims.

What is claimed is:

1. A display device comprising:
    a substrate;
    a driving transistor including a first active layer and a switching transistor including a second active layer, the first active layer and the second active layer being disposed on the substrate;
    a first gate insulating layer disposed on the first active layer of the driving transistor and a second gate insulating layer disposed on the second active layer of the switching transistor;
    a first gate electrode and a second gate electrode disposed on the first gate insulating layer and the second gate insulating layer to overlap the first active layer of the driving transistor and the second active layer of the switching transistor, respectively;
    a first interlayer insulating layer disposed on the first gate electrode and the second gate electrode; and
    a second interlayer insulating layer disposed on the first interlayer insulating layer to overlap the first active layer without overlapping the second active layer in a plan view,
    wherein the second insulating layer is disposed between a first source electrode and a first drain electrode which are respectively connected to a source region and a drain region of the first active layer, and
    wherein the second interlayer insulating layer is spaced apart from at least one of the first source electrode and the first drain electrode.

2. The display device of claim 1, wherein the second interlayer insulating layer is directly disposed on the first interlayer insulating layer.

3. The display device of claim 1, wherein a hydrogen concentration of the second interlayer insulating layer is greater than that of the first interlayer insulating layer.

4. The display device of claim 3, wherein the first interlayer insulating layer includes silicon oxynitride and the second interlayer insulating layer includes silicon nitride.

5. The display device of claim 3, wherein the first interlayer insulating layer includes silicon oxide and the second interlayer insulating layer includes silicon nitride or silicon oxynitride.

6. The display device of claim 3, further comprising a light blocking layer disposed between the substrate and the first active layer,
    wherein the light blocking layer is disposed to overlap the first active layer without overlapping the second active layer.

7. The display device of claim 6, further comprising a barrier layer disposed between the light blocking layer and each of the first active layer and the second active layer,
    wherein a hydrogen concentration of the barrier layer is less than that of the second interlayer insulating layer.

8. The display device of claim 7, wherein the barrier layer includes silicon oxide.

9. The display device of claim 7, wherein the second active layer includes a channel region, a source region disposed on one side of the channel region in a first direction, and a drain region disposed on the other side of the channel region in the first direction,
    wherein the first active layer further includes a channel region disposed between the source region of the first active layer and the drain region of the first active layer, and
    wherein the first gate insulating layer is disposed to overlap the channel region of the first active layer while exposing the source region of the first active layer and the drain region of the first active layer.

10. The display device of claim 9, wherein the first gate electrode and the second gate electrode are disposed to overlap the channel region of the first active layer and the channel region of the section active layer, respectively, and are aligned in a thickness direction with respective side surfaces of the first gate insulating layer and the second gate insulating layer.

11. The display device of claim 10, further comprising:
    a second source electrode connected to the source region of the second active layer of the switching transistor; and
    a second drain electrode connected to the drain region of the second active layer of the switching transistor,
    wherein the first source electrode is connected to the light blocking layer.

12. The display device of claim 9, wherein the first active layer has a first width in a second direction crossing the first direction, the second interlayer insulating layer has a second width in the second direction, and the second width is greater than the first width in a plan view.

13. The display device of claim 12, wherein the second interlayer insulating layer covers the first active layer in the second direction in a plan view.

* * * * *